United States Patent [19]

Ohmi et al.

[11] Patent Number: 5,119,541
[45] Date of Patent: Jun. 9, 1992

[54] WAFER SUCCEPTOR APPARATUS

[75] Inventors: Tadahiro Ohmi, 1-17-301,
Komegabukuro 2-chome, Aoba-ku,
Sendai-shi, Miyagi-ken 980; Masaru
Umeda, Tokyo, both of Japan

[73] Assignee: Tadahiro Ohmi, Miyagi, Japan

[21] Appl. No.: 391,556

[22] PCT Filed: Jan. 28, 1988

[86] PCT No.: PCT/JP88/00067
§ 371 Date: Jul. 25, 1989
§ 102(e) Date: Jul. 25, 1989

[30] Foreign Application Priority Data

Jan. 28, 1987 [JP] Japan .................. 62-19348

[51] Int. Cl.⁵ .......................... H01L 21/205
[52] U.S. Cl. .................. 29/25.02; 118/720;
118/725; 148/DIG. 6
[58] Field of Search .......... 29/25.02; 118/715, 720,
118/725, 728; 148/DIG. 6

[56]  References Cited
U.S. PATENT DOCUMENTS 3,783,822  1/1974  Wollam .................... 118/725
3,980,854  9/1976  Berkman et al. ............ 118/728
4,798,926  1/1989  Sakai ...................... 118/728
4,858,558  8/1989  Ohmura et al. ............. 118/725

FOREIGN PATENT DOCUMENTS 50-747    1/1975  Japan .
51-85649  7/1976  Japan .
53-81069  7/1978  Japan .

Primary Examiner—Robert Kunemund
Assistant Examiner—Ken Horton
Attorney, Agent, or Firm—Baker & Daniels

[57] ABSTRACT

The present invention relates to a wafer succeptor apparatus for mouting and heating a semiconductor wafer provided in a reaction chamber of a semiconductor manufacturing apparatus and the like.

A wafer succeptor apparatus according to the present invention is characterized by comprising a heat release supporter for supporting and heating a wafer, a dense coating film deposited on said heat release supporter and a gas discharge part provided in said heat release supporter where said supporter is not coated with said dense coating film for removing any impurity gas involved in said heat release supporter.

8 Claims, 2 Drawing Sheets

WAFER SUSCEPTOR APPARATUS

TECHNICAL FIELD

The present invention relates to a wafer susceptor apparatus for mounting and heating a semiconductor wafer provided in a reaction chamber of a semiconductor manufacturing apparatus and the like

BACKGROUND OF THE INVENTION

There are known some devices for forming thin films of materials of various sorts on the basis of techniques such as those of CVD (Chemical Vapor Deposition), plasma CVD, optical CVD, and epitaxial growth, etc. In these devices a technique to mount and heat various wafers by making use of a heating system in which radio frequency (hereinafter referred to as RF) induction or optical excitation is employed. Such a technique is adapted to heat a supporter of the wafer by RF induction or optical excitation to thereby further heat the wafer supported by the supporter through heat conduction and thermal radiation. Since much gas is released from a heating supporter a prior susceptor has been structured in such a way that the heating supporter is coated with a dense coating film, through which any gas released by the heating supporter is unlikely to pass through the entire surface of the prior art supporter. Accordingly, any impurity gas which invades the heating supporter upon manufacture of that supporter is usually insufficiently removed therefrom even with degassing effected prior to film formation onto a wafer owning to the presence of the aforementioned dense coating film, and thereby causes the supporter to pollute a reaction chamber. Such a structure thus makes a clean process impracticable as the result of the above-described difficulty. Such a clean process is essential in putting future submicron patterns into practical use. This has been already described in detail in the specification of the application by the present inventor (Japanese Patent Application No. 60-211643. An Apparatus for Treating A Wafer). In what follows, the importance of such a clean process will be described, taking the case of epitaxial growth of silicon.

The progress and development of image sensing and LSI technologies are very rapid, and high sensitivity image sensors have been fabricated in the image sensing field together with DRAMs of 1M bits or more in the LSI field. In order to fabricate high performance electronic devices of this type, a high performance fabrication process is required as a matter of course, which process is thereupon not effected by indefinite factors and has excellent controllability.

A highly clean process for silicon epitaxial growth is an example of such a process. The highly clean process of this type is mainly needed to assure semiconductor devices in which the life times of minority carriers are long. In particular, such a highly clean process is effective for reducing various lattice defects involved on an epitaxial film.

The essential requirement to realize the highly clean epitaxial growth process for fabrication of high performance semiconductor devices is to remove almost all unnecessary gas components other than those required for attendant reaction from the atmosphere in a reaction chamber in which the process proceeds. That is, an ultracleaning process is essential to the realization of the highly clean epitaxial growth process indispensable to the manufacture of high sensitivity image sensors and ultrafine LSIs.

The epitaxial growth of silicon is, as expressed by for example:

$$SiH_4 \rightarrow Si + 2H_2 \quad (1)$$

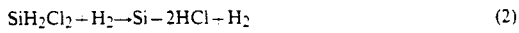

$$SiH_2Cl_2 + H_2 \rightarrow Si + 2HCl + H_2 \quad (2)$$

achieved by thermal decomposition of silane ($SiH_4$) (formula (1)) and a hydrogen reducing reaction of dichlorosilane ($SiH_2Cl_2$) (formula (2)).

However if the reaction atmosphere includes water ($H_2O$), nitrogen ($N_2$), oxygen ($O_2$), carbon monoxide (CO), carbon dioxide ($CO_2$), chlorine (Cl), hydrogen chloride (HCl), hydrocarbon ($C_3H_3$, etc.), and heavy metals (Au, etc.), then nitrogen, oxygen, carbon, chlorine, heavy metals (Au, etc.) and the like will invade into an epitaxial film to form an electrically deep level. In order to prevent this deep level from being formed, it is necessary to highly clean the reaction atmosphere.

The reaction atmosphere thus made extremely clean can prevent unnecessary impurities from invading into the epitaxial film. Namely, there is produced little density of the deep levels in a semiconductor with reduced unnecessary impurities to assure an epitaxial film with minority carriers each having a long life time in a semiconductor device.

Such a clean reaction atmosphere enables, as described above, an epitaxial film to be grown with minority carriers which have a long life time.

In order to make the reaction atmosphere clean, a gas supply system leading from a raw gas cylinder (or liquefied gas vessel) to a reaction chamber, the reaction chamber itself, and a gas exhaust system, must be cleaned together.

The major conditions to satisfy the above-described requirement are as follows:

1. Raw gases should be highly pure as much as possible.

2. For the gas supply system, reaction chamber, and exhaust system, (a) any leakage of gas from the outside should be reduced to the utmost to result in no pollution from the atmosphere; and (b) released gas from the piping system and pipe walls of the reaction chamber should be sufficiently reduced.

In other words, the materials for constructing the piping system and the reaction chamber should not contain any gas. In addition, the surface of any pipe wall should be sufficiently flat, and not have the properties of any layer changed upon processing for the purpose of a sufficient reduction of adsorbed gas. At the same time, an apparatus should be so provided as to adequately prevent the interiors of the reaction chamber and the gas supply piping system from being exposed to the atmosphere.

(c) any dead zone of the system in which any gas resides should be eliminated, and (d) production of particles should be reduced as much as possible, and if any movable member is required, any slideable part in the interiors of the gas supply system and the reaction system should be avoided, wherever practicable.

Some of these conditions may possibly be achieved by proper control or manipulation, but production of impurity gas from elements which constitute the reaction chamber is a problem of the arrangement of each of those elements in the reaction chamber, and hence the construction of those elements thereof is critical.

In this situation, it is particularly important to provide a susceptor which supports and heats a wafer in the reaction chamber upon the growth of an epitaxial film. For this, a structure is needed which is capable of sufficiently degassing the susceptor before the growth.

Conventionally, in order to reduce released gas from the susceptor upon the growth of an epitaxial film, a dense coating film (e.g., SiC film) is deposited over the entire surface of a heating supporter (e.g., a sintered body of carbon) of the susceptor involving large amounts of impurities. It is however difficult, with only this deposition method, to completely prevent any impurity gas from being freed from the heating supporter with the aid of the dense coating film under high temperature conditions during the growth of an epitaxial film. Therefore, the susceptor is usually subjected to a degassing treatment by heating it in a state of high vacuum or in a high purity gas before film formation. However, it is difficult for such an arrangement, in which the dense coating film is deposited over the entire surface of the heating supporter of the susceptor, to remove impurities contained in the heating supporter by the aforementioned degassing treatment before film formation.

In view of the drawbacks of the prior techniques, it is an object of the present invention to provide a wafer susceptor apparatus capable of removing impurity gas contained in a heat release supporter with the aid of a gas discharge part.

SUMMARY OF THE INVENTION

In order to achieve the above object, a wafer susceptor apparatus according to the present invention comprises a heating supporter for supporting and heating a wafer, a dense coating film deposited on the heating supporter, and a gas discharge part composed of a non-coated portion of the aforementioned dense coating film for removing impurity gas contained in the heating supporter.

According to the arrangement of the present invention, any impurity gas contained in the heating supporter of the wafer susceptor can be removed completely by heating the susceptor in a vacuum or in purified gas, and hence any impurity gas from the susceptor upon film formation can be prevented from being freed. There is one embodiment wherein an adsorption active material (e.g., high melting point metal such as carbon and molybdenum (Mo), etc.) is employed as the heating supporter. Thereupon, the influence of adsorption on the epitaxial growth mechanism can be reduced by depositing a coating film (e.g., a silicon thin film and the like) on the gas discharge part of the susceptor after degassing is satisfactorily conducted.

DESCRIPTION OF THE PREFERRED EMBODIMENT

In what follows, a preferred embodiment will be described with reference to the accompanying drawings.

Figure 1A:
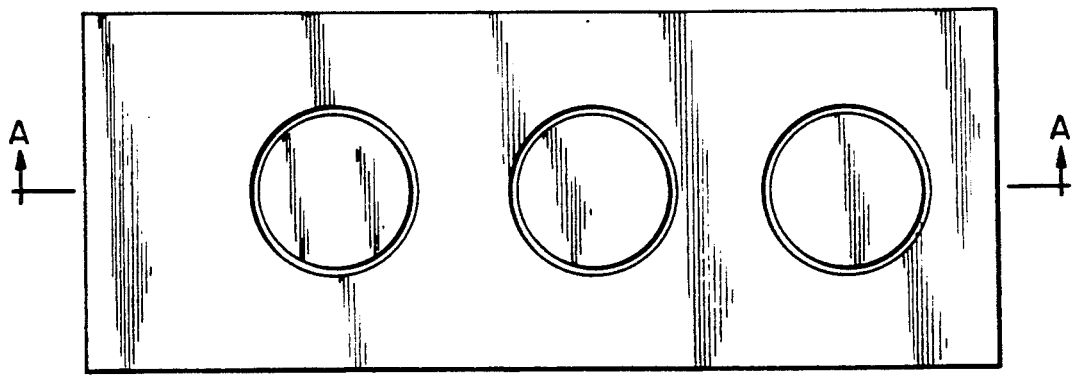
FIG. 1 is a drawing showing a wafer susceptor apparatus construction according to the present invention, where (a) is a plan view illustrating a wafer susceptor apparatus for supporting and heating a wafer and (b) is a cross sectional view of (a) along line A—A'.
Figure 1B:
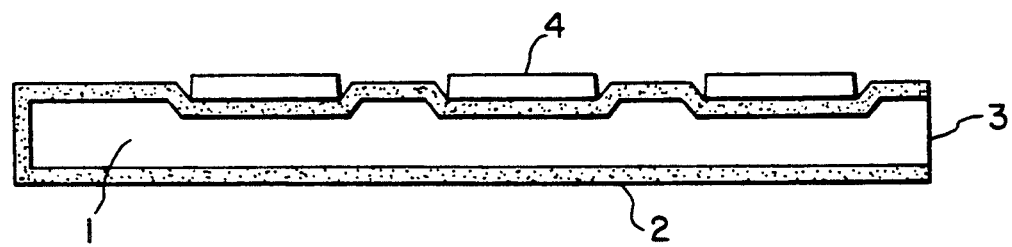

FIG. 1 is a drawing showing the wafer susceptor apparatus construction of the present invention, where (a) and (b) respectively illustrate a plan view of a wafer susceptor apparatus of the present invention and a cross sectional view of the same along line A—A' of FIG. 1(a). 1 is a heating supporter made of a sintered body of carbon which serves to support a wafer and 2 is a thin film of SiC with which the surface of a heating supporter is coated in part. 3 is a gas discharge part which is not coated with the thin film of SiC. 4 is a wafer mounted on the surface of the wafer susceptor apparatus.

Although, in FIG. 1(a), the wafer susceptor is illustrated as a rectangular parallelepiped, it may be disc-shaped or may be a flat plate, a doughnut-shaped plate or may be formed in other various shapes in accordance with practical use. In addition, although the gas discharge part 4 is formed over one entire surface of the rectangular parallelepiped as shown in FIG. 1, the gas discharge part may be provided in other proper forms. For example, it may be provided partly over one surface of the rectangular parallelepiped, or it may be distributed over a plurality of surfaces of the rectangular parallelepiped at prescribed portions thereof, without limitation only to the one surface as shown in FIG. 1.

The gas discharge part of the wafer susceptor is desirably provided at a location downstream of the gas flow formed upon film formation. This is for preventing impurities released from the gas discharge part from being adsorbed into the wafer support part when the susceptor is degassed in an atmosphere of purified gas before film formation.

Figure 2:
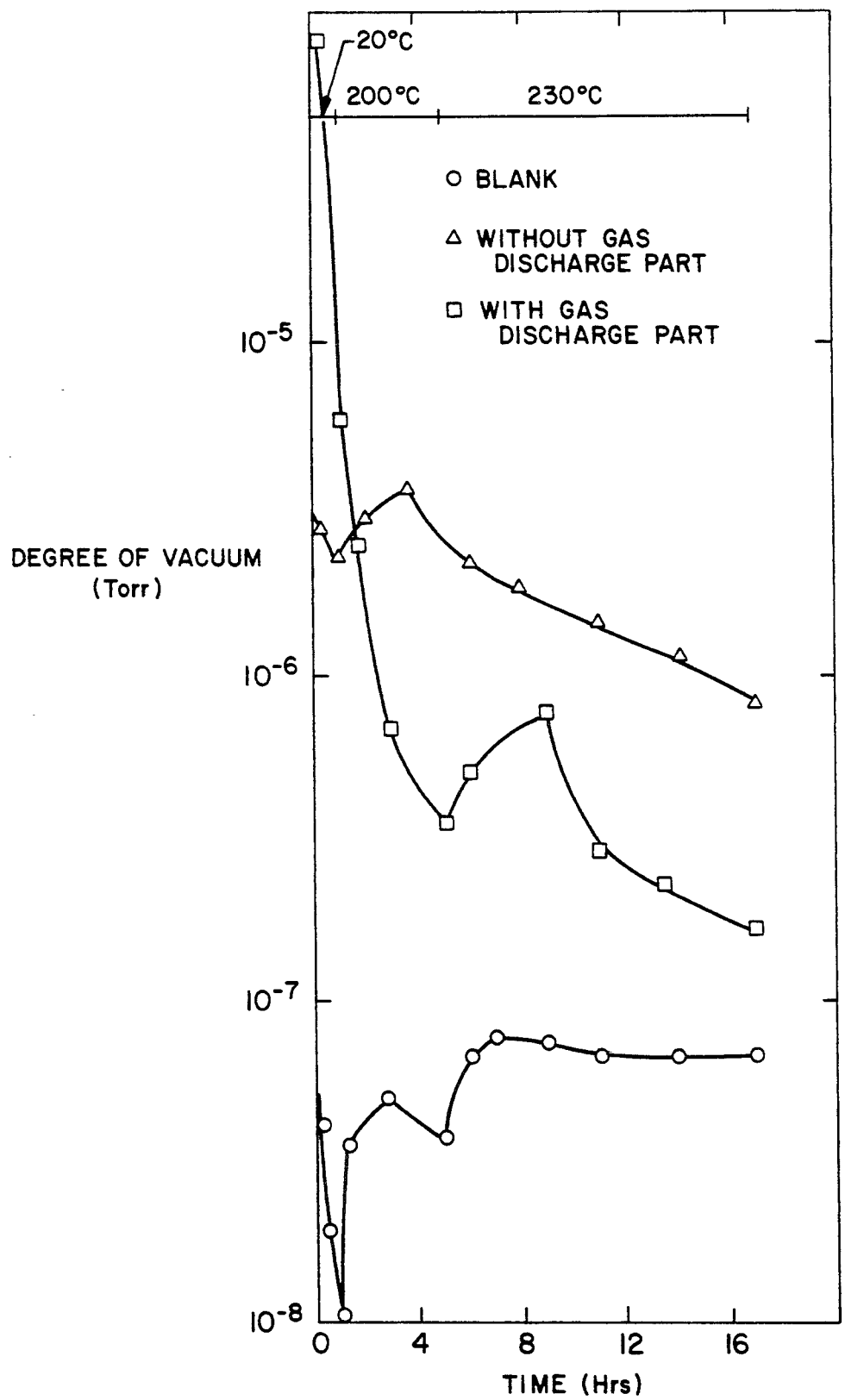
FIG. 2 is a graphical representation showing the relationship between heating time and the degree of vacuum in a vacuum chamber in the embodiment of the present invention.

Referring here to FIG. 2, there is provided data associated with changes in the degree of vacuum corresponding to the amount of released gas when the susceptor apparatus shown in FIG. 1 is accommodated in the vacuum chamber of a vacuum exhaust unit (340 l/s) and heated by a heater located outside of the vacuum chamber. The degree of vacuum was measured with the use of an ionization vacuum indicator. The axis of abscissas in FIG. 2 represents the heating time while the axis of ordinates represents the degree of vacuum in the chamber. Numerical values at the top of FIG. 2 indicate heating temperatures at each indicated time. Changes in the degree of vacuum in heating a susceptor coated with an SiC film over the entire surface thereof is depicted in FIG. 2, the susceptor having the same structure as that shown in FIG. 1 with the exception that the gas discharge part 3 of FIG. 1 is coated with an SiC coating film. The susceptor which includes a gas discharge part discharges greater amounts of gases at the initial stage of vacuum extraction than a susceptor without a discharge part but after two hours the gas discharge amounts are reduced. Moreover, heating the susceptor from 200° C. to 230° C. causes the amount of discharged gases to be increased corresponding to the temperature rise. It is therefore obvious from the above description that the present invention enables degassing of the susceptor to be effectively achieved by heating it in a vacuum provided the gas discharge part is formed on the wafer susceptor apparatus.

A quartz reaction tube, in which the degassed wafer susceptor is mounted, is connected with a stainless steel flange and with the aid of the hermetic property of the reaction chamber is adapted to cause gas leakage of the connection part between the susceptor and the stainless steel flange from the outside to be less than $2 \times 10^{-11}$ atm cc/sec so as to permit the wafer susceptor not to be exposed to the atmosphere. In order to make the quartz reaction tube highly clean, the reaction chamber is evacuated by a vacuum exhaust device (340 l/s) connected with the quartz reaction tube via the stainless steel flange, and is heated at the maximum temperature of 550° C. in a furnace by use of both resistance and infrared heating the degree of vacuum inside the reaction chamber after cooling thereof to room temperature was $7.2 \times 10^{-10}$ Torr. in the case of heating the wafer susceptor with the use of RF, the temperature of the quartz tube can be prevented from being raised to thereby further prevent any impurity gas from being released therefrom and so that the reaction atmosphere can be kept clean.

By coating the gas discharge part of the wafer susceptor with a dense coating film after sufficient degassing of the wafer susceptor provided with a gas discharge part, any impurity gas from the susceptor can be more completely prevented from being released. When the wafer susceptor shown in FIG. 1, after being mounted in the reaction chamber which had already been highly cleaned, was heated to the maximum temperature of 908° C. in the same chamber which had already been vacuum-evacuated by the vacuum exhaust device (340 l/s), the reaction chamber reached the degree of vacuum of $3.2 \times 10^{-8}$. Successively, after the susceptor was heated to 800° C. and coated with polycrystalline silicon over the surface thereof including the gas discharge part by making use of thermal decomposition of silane gas, the reaction chamber including the susceptor was vacuum-evacuated by a vacuum exhaust device (340 l/s) and the susceptor was heated to 911° C. At that time the inside of the reaction chamber reached the degree of vacuum of $9.0 \times 10^{-9}$ Torr.

Since the wafer is mounted in the reaction chamber by means of a wafer transfer load locking device of the electrostatic chuck type serving only for the wafer, the wafer susceptor which has already been degassed will not be exposed to the atmosphere and so is kept clean.

A clean and dry wafer is mounted on a silicon epitaxial device equipped with the wafer susceptor apparatus of the present invention described above using the electrostatic chuck type load locking means, and heated at 1202° C. for 10 minutes by RF heating in the atmosphere of purified hydrogen gas at the pressure of 760 Torr, and further heated at 890° C. for 150 minutes in the atmosphere of a mixture of purified silane gas and hydrogen gas at 80 Torr for effecting epitaxial growth of silicon. A diode of metal-oxide film-semiconductor (silicon) was fabricated by use of the silicon epitaxial film formed as such as the semiconductor, which showed an impurity concentration of 6.0 msec. Thus, the silicon epitaxial growth device equipped with the wafer susceptor apparatus of the present invention assures a high performance device.

Although in the above description carbon is employed as the heating supporter with a SiC film employed as the dense coating film, the heating supporter of the wafer susceptor apparatus according to the present invention may employ besides carbon, high melting point metals such as molybdenum (Mo) including any other materials which can release heat by RF induction and optical excitation. In addition, the dense coating film may be made of, besides SiC, silicon, silicon nitride ($Si_3N_4$), silicon oxide ($SiO_2$), aluminum nitride (AlN), and alumina ($Al_2O_3$) including other materials which are dense when various heating supporters are coated therewith.

According to the wafer susceptor apparatus equipped with a gas discharge part of the present invention, any impurity gas involved in the heating supporter of the wafer susceptor can be sufficiently removed by heating the susceptor in a vacuum or in purified gas whereby any impurity gas can be prevented from being released from the susceptor upon film formation. Having such a feature, the wafer susceptor apparatus can improve the performance of a semiconductor manufacturing apparatus by one effort. Moreover, the wafer susceptor apparatus of the present invention can form a dense coating film with only one deposition process upon depositing the dense coating film on the heating supporter in a susceptor fabrication process, by holding the surface of the gas discharge part on a supporter of a dense coating film deposition device in contact therewith, and thus permits an inexpensive, high performance semiconductor manufacturing apparatus to be produced with a reduced total number of associated processes, as compared with the case of overall deposition which requires two or more associated processes.

Although a semiconductor wafer was chiefly described up to now, the wafer susceptor apparatus of the present invention can be applied to any other wafer such as metal wafers and insulator wafers, etc.

We claim:

1. A wafer susceptor apparatus for mounting and heating a wafer in a reaction chamber, said susceptor comprising:
a heating supporter for supporting and heating a wafer, a dense uninterrupted coating film formed on the entire surface of said heating supporter except for a pre-planned exposed surface portion thereof whereby said exposed surface portion forms a gas discharge means for releasing impurity gas from said supporter, such exposed surface portion being located such that impurity gases released from said gas discharge means will not contaminate a said wafer located on said heating supporter.

2. A wafer susceptor apparatus according to claim 1, wherein said gas discharge means is located downstream of the location of a wafer supported on said heating supporter during the formation of a film.

3. A wafer susceptor apparatus according to claim 1, wherein said heating supporter is composed of sintered carbon.

4. A wafer susceptor apparatus according to claim 1, wherein said dense coating film is composed of SiC.

5. A wafer susceptor apparatus according to claim 1, wherein said dense coating film is made of Si, $SiO_2$, $Si_3N_4$, AlN or $Al_2O_3$.

6. A wafer susceptor apparatus according to claim 1, wherein said wafer susceptor is shaped as a rectangular parallelepiped.

7. A wafer apparatus according to claim 1, wherein said wafer susceptor is a disc-shaped or a doughnut-shaped flat plate.

8. A wafer susceptor apparatus according to claim 1, wherein the entire surface of one face of said heating supporter forms said gas discharge means.

* * * * *